(12) United States Patent
Tang et al.

(10) Patent No.: US 11,693,474 B2
(45) Date of Patent: Jul. 4, 2023

(54) CIRCUITRY APPLIED TO MULTIPLE POWER DOMAINS

(71) Applicant: Realtek Semiconductor Corp., HsinChu (TW)

(72) Inventors: Wei-Cheng Tang, HsinChu (TW); Li-Lung Kao, HsinChu (TW); Chia-Ling Chang, HsinChu (TW); Sheng-Wei Lin, HsinChu (TW); Sheng-Tsung Wang, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 123 days.

(21) Appl. No.: 17/329,164

(22) Filed: May 25, 2021

(65) Prior Publication Data

US 2022/0026979 A1    Jan. 27, 2022

(30) Foreign Application Priority Data

Jul. 21, 2020    (TW) .................................. 109124504

(51) Int. Cl.
  *G06F 1/3296* (2019.01)
  *G06F 1/3234* (2019.01)
(52) U.S. Cl.
  CPC .......... *G06F 1/3296* (2013.01); *G06F 1/3243* (2013.01)

(58) Field of Classification Search
  CPC .............................. G06F 1/3296; G06F 1/3243
  See application file for complete search history.

(56) References Cited

U.S. PATENT DOCUMENTS

| | | | | |
|---|---|---|---|---|
| 5,786,724 A * | 7/1998 | Teggatz | ................. | H03K 5/003 327/333 |
| 2005/0285671 A1* | 12/2005 | Chang | ..................... | H03F 1/305 330/51 |
| 2008/0054989 A1* | 3/2008 | Choi | ............... | H03K 19/00384 327/534 |
| 2009/0243392 A1* | 10/2009 | Huang | .................... | H03F 3/213 341/141 |
| 2014/0307513 A1* | 10/2014 | Chun | ..................... | G11C 5/147 365/189.09 |

* cited by examiner

*Primary Examiner* — Nimesh G Patel
(74) *Attorney, Agent, or Firm* — Winston Hsu

(57) ABSTRACT

The present invention provides a circuitry applied to multiple power domains. An amplifier of the circuitry includes an output stage and a switching circuit. The output stage includes a first transistor and a second transistor, wherein the first transistor is coupled between a supply voltage and an output terminal, the second transistor is coupled between the output terminal and a ground voltage. The switching circuit is configured to choose a body of the first transistor from the supply voltage or a reference voltage.

14 Claims, 5 Drawing Sheets

CIRCUITRY APPLIED TO MULTIPLE POWER DOMAINS

BACKGROUND OF THE INVENTION

1. Field of the Invention

The present invention relates to a circuitry applied to multiple power domains.

2. Description of the Prior Art

In an analog circuitry corresponding to multiple power domains, when a circuit block corresponding to one of the power domains does not need to be operated, that is to say the circuit block enters a sleep state, the power domain will stop generating a supply voltage to the circuit block for power saving. At this time, however, the circuit blocks that correspond to other power domains are still active which may have leakage current. The unexpected current flows into the circuit blocks in the sleep state. In order to solve the leakage current problems, some prior arts avoid this problem by adding switching elements into a signal transmission path among different circuit blocks. However, not every signal transmission path is suitable for this insertion method, how to propose a method that can effectively reduce the leakage currents among multiple power domains is an important topic.

SUMMARY OF THE INVENTION

It is therefore an objective of the present invention to provide a circuitry applied to the multiple power domains, which can effectively avoid the leakage currents between two different circuit blocks without breaking the signal transmission path mentioned in the prior art.

According to one embodiment of the present invention, a circuitry applied to multiple power domains is disclosed. The circuitry comprises a first amplifier and a second amplifier, wherein the first amplifier is configured to receive an input signal and generate a processed input signal. The first amplifier is supplied by a first supply voltage of a first power domain, and the second amplifier is connected to the output of the first amplifier. The second amplifier is configured to receive the processed input signal and generate an output signal. The second amplifier is supplied by a second supply voltage of a second power domain. The second amplifier comprises an output stage and a switching circuit. The output stage comprises a first transistor and a second transistor, wherein the first transistor is coupled between the second supply voltage and an output terminal, and the second transistor is coupled between the output terminal and a ground voltage. The switching circuit is configured to choose the body voltage of the first transistor from the second supply voltage or a reference voltage.

According to one embodiment of the present invention, a circuitry applied to multiple power domains is disclosed. An amplifier of the circuitry comprises an output stage and a switching circuit. The output stage comprises a first transistor and a second transistor, wherein the first transistor is coupled between a supply voltage and an output terminal, the second transistor is coupled between the output terminal and a ground voltage. The switching circuit is configured to choose the body voltage of the first transistor from the supply voltage or a reference voltage.

According to another embodiment of the present invention, a circuitry applied to multiple power domains is disclosed. The circuitry comprises a first amplifier and a second amplifier, wherein the first amplifier is configured to receive an input signal and generate a processed input signal. The first amplifier is supplied by a first supply voltage of a first power domain, and the second amplifier is connected to the output of first amplifier. The second amplifier is configured to receive the processed input signal and generate an output signal. The second amplifier is supplied by a second supply voltage of a second power domain. The first amplifier comprises an output stage and a switching circuit. The output stage comprises a first transistor and a second transistor, wherein the first transistor is coupled between the first supply voltage and an output terminal, and the second transistor is coupled between the output terminal and a ground voltage The switching circuit is configured to choose the body of the first transistor from the first supply voltage or a reference voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 1A:
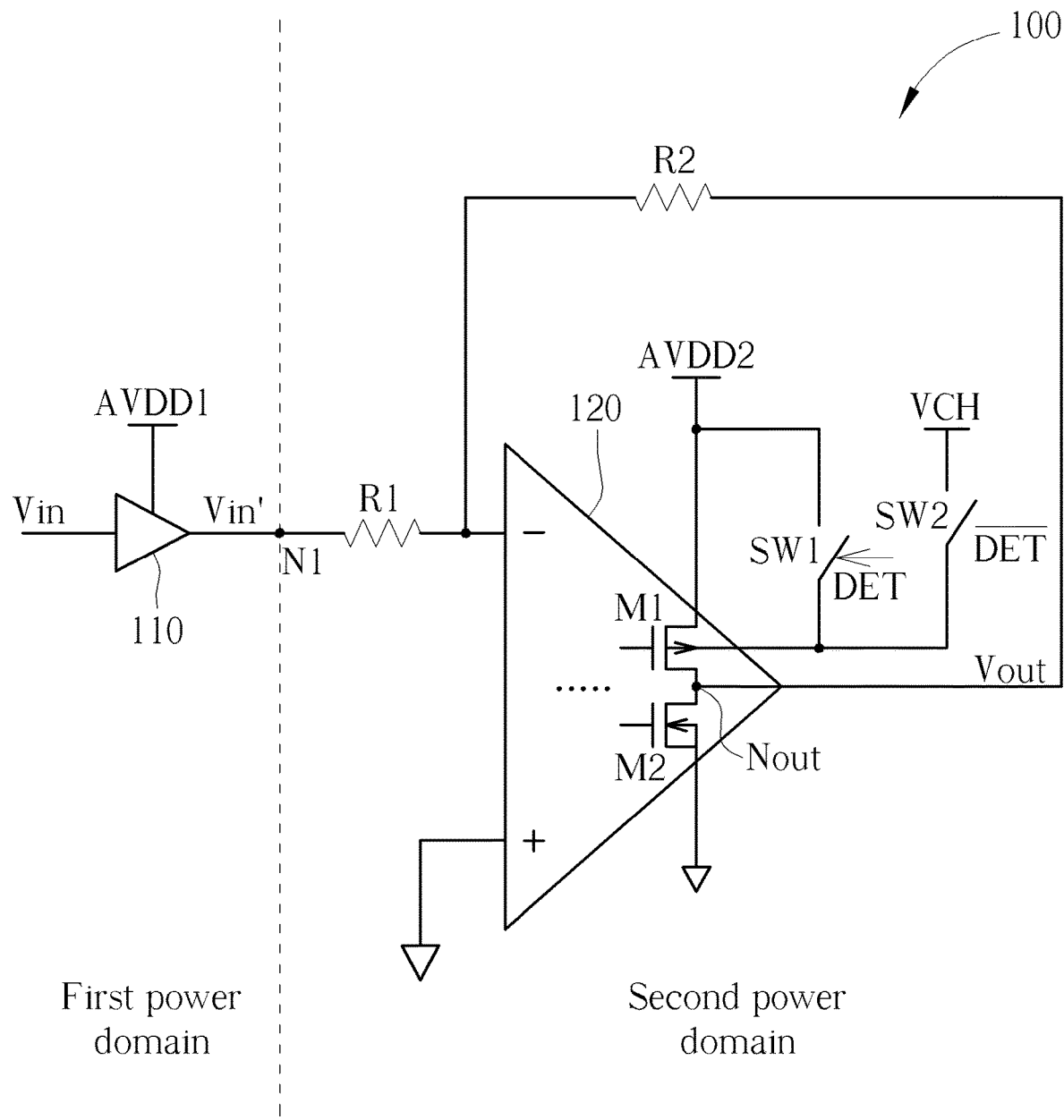
FIG. 1A is a diagram illustrating a circuitry applied to multiple power domains according to one embodiment of the present invention.

FIG. 1A is a diagram illustrating a circuitry 100 applied to multiple power domains according to one embodiment of the present invention. As shown in FIG. 1A, the circuitry 100 includes a first amplifier 110 and a second amplifier 120, wherein the first amplifier 110 receives a first supply voltage AVDD1 of a first power domain, and the second amplifier 120 receives a second supply voltage AVDD2 of a second power domain. In this embodiment, the second amplifier 120 comprises a plurality of amplifying stages and an output stage (FIG. 1A merely shows the output stage related to the present invention), and the output stage comprises a first transistor M1 and a second transistor M2, wherein a source electrode of the first transistor M1 is coupled to the second supply voltage AVDD2, a drain electrode of the first transistor M1 is coupled to an output terminal Nout of the output stage (or the output terminal Nout of the second amplifier 120), a drain electrode of the second transistor M2 is coupled to the output terminal Nout of the output stage, and a source electrode of the second transistor M2 is coupled to a ground voltage. In addition, the second amplifier 120 has a feedback circuit (represented by a feedback resistor R2) coupled between an input terminal and the output terminal Nout, and the second amplifier 120 further comprises a switching circuit including two switches SW1 and SW2.

Figure 1B:
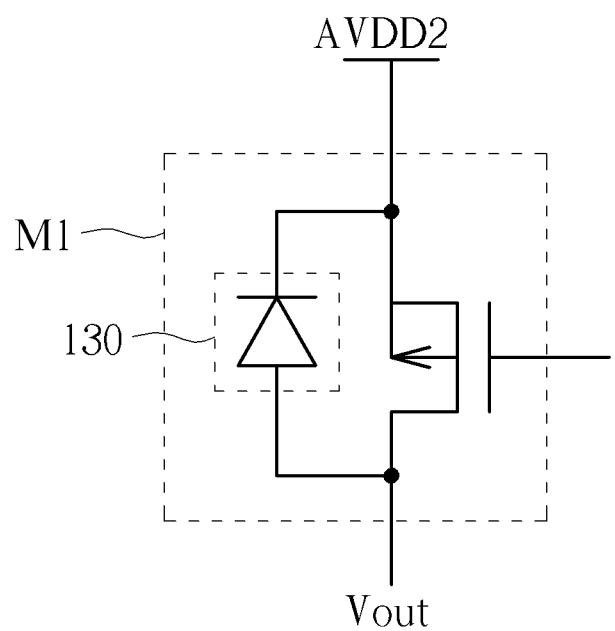
FIG. 1B is a diagram of the leakage current caused by the first transistor when the second supply voltage disappears.

In the operation of the circuitry 100, the first amplifier 110 receives an input signal Vin and generates a processed input signal Vin', and the second amplifier 120 receives the processed input signal Vin' to generate an output signal Vout. In some applications, when a circuit block corresponding to the second power domain in the circuitry 100 enters the sleep state, the first amplifier 110 in the first power domain still needs to operate so that a terminal N1 maintains a fixed voltage value. Since the terminal N1 has a fixed voltage value, the fixed voltage value will pass through a resistor R1 and the feedback resistor R2 so that the output terminal Nout of the second amplifier 120 will also have the fixed voltage value. At this time, because the second supply voltage AVDD2 disappears, a parasitic diode of the first transistor M1 itself will be turned on, causing the second supply voltage AVDD2 to rise and cause unexpected leakage current. As shown in FIG. 1B, the leakage current caused by the parasitic diode 130 exists in all the operating regions of the first transistor M1 (i.e. linear region/saturation region/cut-off region). To solve this problem, this embodiment proposes to additionally provide switches SW1 and SW2 in the second amplifier 120 to selectively connect a body of the first transistor M1 to the second supply voltage AVDD2 or a reference voltage VCH.

Specifically, in the state where both the first power domain and the second power domain are normally powered, the switch SW1 is in a conducting state and the switch SW2 is in a non-conducting state, so that the base of the first transistor M1 is connected to the second supply voltage AVDD2. At this time, the operation of the circuitry 100 can be regarded as two conventional amplifiers, so the detailed operations are omitted here. In addition, when the circuit block corresponding to the second power domain in the circuitry 100 enters the sleep state, and the first amplifier 110 in the first power domain continues to operate to maintain the terminal N1 at the fixed voltage value, the switch SW1 is in the non-conducting state and the switch SW2 is in the conducting state, so that the base of the first transistor M1 is connected to the reference voltage VCH, and the parasitic diode of the first transistor M1 is maintained in a reverse-biased state to avoid the leakage current of the first transistor M1. In one embodiment, in order to maintain the parasitic diode of the first transistor M1 in the reverse-biased state, the level of the reference voltage VCH needs to be higher than a voltage level of the output terminal Nout minus a voltage drop value of the parasitic diode of the first transistor M1 (e.g. 0.6-0.7V), and the reference voltage VCH can be generated by the first supply voltage AVDD1 or a common mode voltage of the processed input signal Vin' (for example, the reference voltage VCH can be obtained by dividing the first supply voltage AVDD1).

Figure 2:
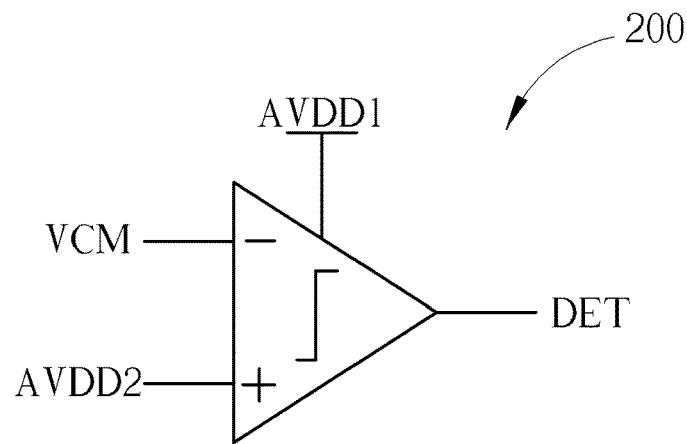
FIG. 2 is a diagram illustrating a detection circuit according to one embodiment of the present invention.

In an embodiment, the circuitry 100 may additionally include a detection circuit, and the detection circuit is used to detect whether the second supply voltage AVDD2 provided to the second amplifier 120 exists, so as to generate a detection result to control the switches SW1 and SW2. Specifically, FIG. 2 is a diagram illustrating a detection circuit 200 according to an embodiment of the invention. As shown in FIG. 2, the detection circuit 200 can be a comparator supplied by the first supply voltage AVDD1, and the detection circuit 200 is configured to compare if the second supply voltage AVDD2 is higher than a reference voltage VCM to generate a detection result DET, where the reference voltage VCM can be generated by the first supply voltage AVDD1. In this embodiment, when the detection result DET indicates that the second supply voltage AVDD2 exists, the detection result DET enables the switch SW1 while the inverted signal $\overline{DET}$ disables the switch SW2, so that the base of the first transistor M1 is connected to the second supply voltage AVDD2. When the detection result DET indicates that the second supply voltage AVDD2 does not exist, the detection result DET disables the switch SW1 while the inverted signal $\overline{DET}$ enables the switch SW2, so that the base of the first transistor M1 is connected to the reference voltage VCH.

In one embodiment, the circuitry 100 may be applied to an audio processing circuit in a desktop computer, a notebook computer or a mobile device, and the input signal Vin may be a sound signal from a microphone. In an example, the terminal N1 is also connected to a circuit node of an audio playback device. Therefore, in order to prevent the voltage level of the terminal N1 from changing too much and causing popping during the switching process between the sleep state and the normal state, the first amplifier 110 will continue to operate to make the terminal N1 have a fixed DC voltage level. The switches SW1 and SW2 proposed in the present invention can effectively solve the leakage current problem of the second amplifier 120, especially when the signal transmission path between the first amplifier 110 and the second amplifier 120 cannot be completely blocked.

In one embodiment, the circuitry 100 may be applied to a programmable gain amplifier (PGA) with variable resistance, and its main structure is to insert multiple switched resistors between the first amplifier 110 and the second amplifier 120. In consideration of a total harmonic distortion (THD), since the first amplifier 110 and the second amplifier 120 are not suitable for inserting the switching elements that completely block the signal path, the switches SW1 and SW2 proposed in the present invention can effectively solve the leakage current problem of programmable amplifier with variable resistance.

In practice, the second amplifier 120 in FIG. 1 may have a differential input and a differential output, that is, the second amplifier 120 may have two sets of output stages each including the first transistor M1, the second transistor M2 and the corresponding switches.

Figure 3:
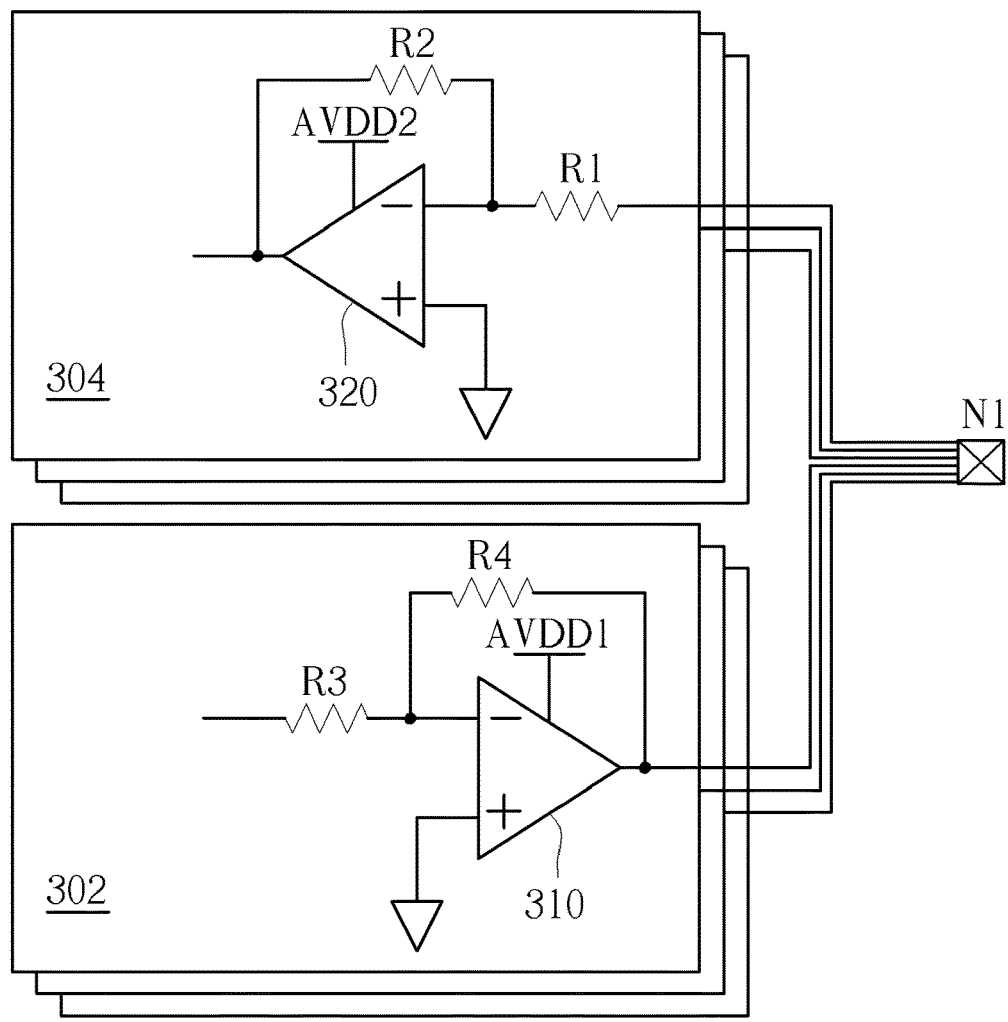
FIG. 3 is a diagram illustrating a circuitry applied to multiple power domains according to another embodiment of the present invention.

The circuitry 100 shown in FIG. 1A is within a chip. In other embodiments, the circuit blocks of the first power domain and the circuit blocks of the second power domain may be located in different chips. For example, refer to a circuitry shown in FIG. 3, which includes multiple first circuit blocks 302 and multiple second circuit blocks 304, wherein the first circuit blocks 302 and the second circuit blocks 304 can be different chips connected to the common terminal N1. In this embodiment, the first circuit block 302 is similar to the first amplifier 110 shown in FIG. 1A, that is, the first circuit block 302 includes an amplifier 310 connected to the first supply voltage AVDD1 and related resistors R3, R4; and the second circuit block 304 is similar to the second amplifier 120 shown in FIG. 1A, that is, the second circuit block 304 includes an amplifier 320 connected to the second supply voltage AVDD2, a resistor R1 and a feedback resistor R2. The operations of the first circuit block 302 and the second circuit block 304 can refer to the first amplifier 110 and the second amplifier 120 shown in FIG. 1A, respectively, when the second supply voltage AVDD2 disappears, there will be no leakage current flowing from the first circuit block 302 to the second circuit block 304, so it can effectively save power consumption.

Figure 4:
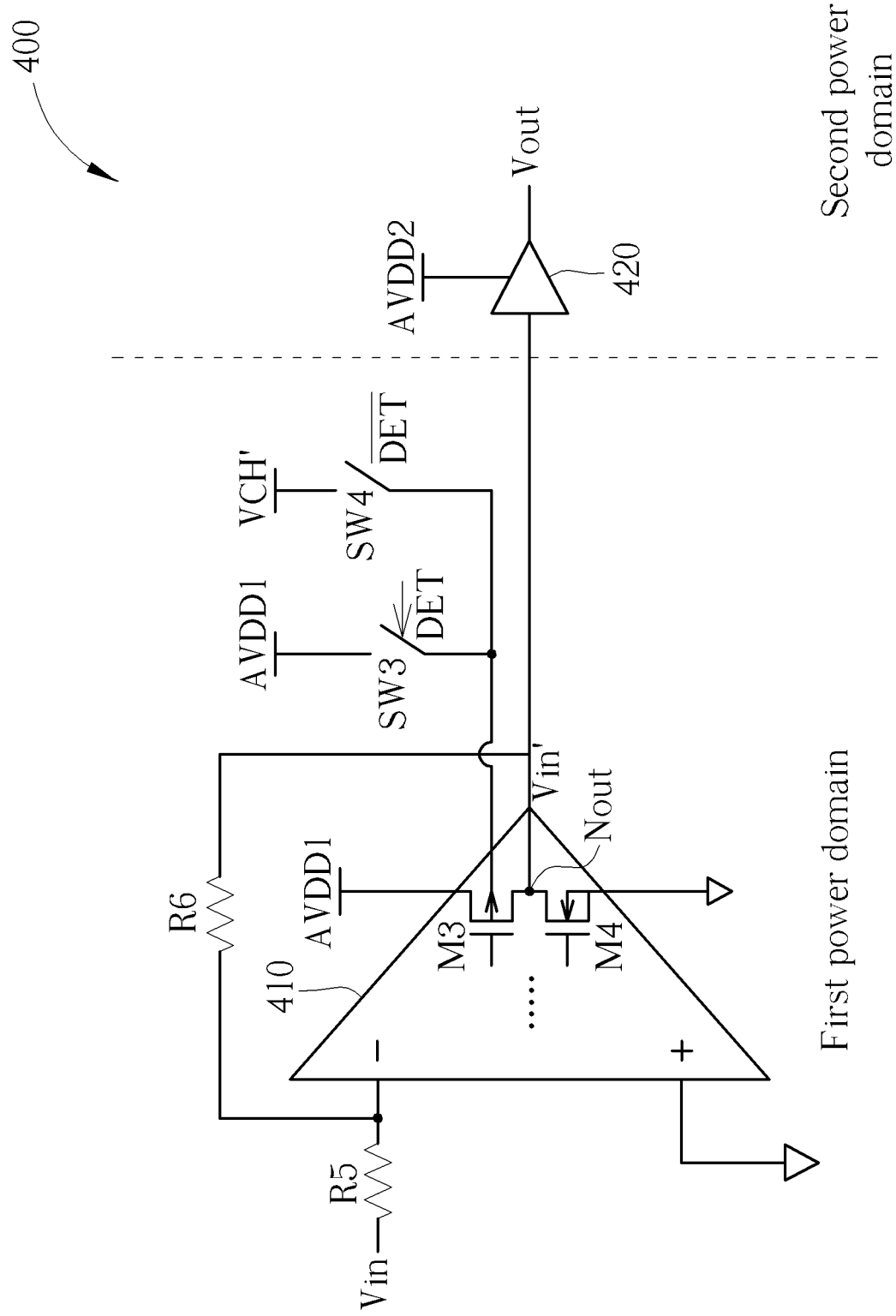
FIG. 4 is a diagram illustrating a circuitry applied to multiple power domains according to another embodiment of the present invention.

The above embodiments describe the related design when the second supply voltage AVDD2 of the second power domain disappears. However, the above concept can also be applied to the design when the first supply voltage AVDD1 disappears. Specifically, FIG. 4 is a diagram illustrating a circuitry 400 according to one embodiment of the present invention. As shown in FIG. 4, the circuitry 400 comprises a first amplifier 410 and a second amplifier 420, wherein the first amplifier 410 receives a first supply voltage AVDD1 of a first power domain, and the second amplifier 420 receives a second supply voltage AVDD2 of a second power domain. In this embodiment, the first amplifier 410 comprises a plurality of amplifying stages and an output stage (FIG. 4 merely shows the output stage related to the present invention), and the output stage comprises a first transistor M3 and a second transistor M4, wherein a source electrode of the first transistor M3 is coupled to the first supply voltage AVDD1, a drain electrode of the first transistor M3 is coupled to an output terminal Nout of the output stage (or the output terminal Nout of the first amplifier 410), a drain electrode of the second transistor M4 is coupled to the output terminal Nout of the output stage, and a source electrode of the second transistor M4 is coupled to a ground voltage. In addition, the first amplifier 410 has a feedback circuit (represented by a feedback resistor R6) coupled between an input terminal and the output terminal Nout, and the first amplifier 410 further comprises a switching circuit including two switches SW3 and SW4.

In the operation of the circuitry 400, the first amplifier 410 receives an input signal Vin and generates a processed input signal Vin', and the second amplifier 420 receives the processed input signal Vin' to generate an output signal Vout. In some applications, when a circuit block corresponding to the first power domain in the circuitry 400 enters the sleep state, the second amplifier 420 in the second power domain still needs to operate so that the output terminal of the second amplifier 420 maintains a fixed voltage value. Since the output terminal of the second amplifier 420 has a fixed voltage value, the output terminal Nout of the first amplifier 410 also has a fixed voltage value. At this time, because the first supply voltage AVDD1 disappears, a parasitic diode of the first transistor M3 itself will be turned on, causing the first supply voltage AVDD1 to rise and cause unexpected leakage current. To solve this problem, this embodiment proposes to additionally provide switches SW3 and SW3 in the first amplifier 410 to selectively connect a body of the first transistor M3 to the first supply voltage AVDD1 or a reference voltage VCH'.

Specifically, in the state where both the first power domain and the second power domain are normally powered, the switch SW3 is in a conducting state and the switch SW4 is in a non-conducting state, so that the base of the first transistor M3 is connected to the first supply voltage AVDD1. At this time, the operation of the circuitry 400 can be regarded as two conventional amplifiers, so the detailed operations are omitted here. In addition, when the circuit block corresponding to the first power domain in the circuitry 400 enters the sleep state, and the second amplifier 420 in the second power domain continues to operate to maintain the output terminal of the second amplifier 420 at the fixed voltage value, the switch SW3 is in the non-conducting state and the switch SW4 is in the conducting state, so that the base of the first transistor M3 is connected to the reference voltage VCH', and the parasitic diode of the first transistor M3 is maintained in a reverse-biased state to avoid the leakage current of the first transistor M3. In one embodiment, in order to maintain the parasitic diode of the first transistor M3 in the reverse-biased state, the level of the reference voltage VCH' needs to be higher than a voltage level of the output terminal Nout minus a voltage drop value of the parasitic diode of the first transistor M3 (e.g. 0.6V-0.7V), and the reference voltage VCH' can be generated by the second supply voltage AVDD2 (for example, the reference voltage VCH can be obtained by dividing the second supply voltage AVDD2).

Figure 5:
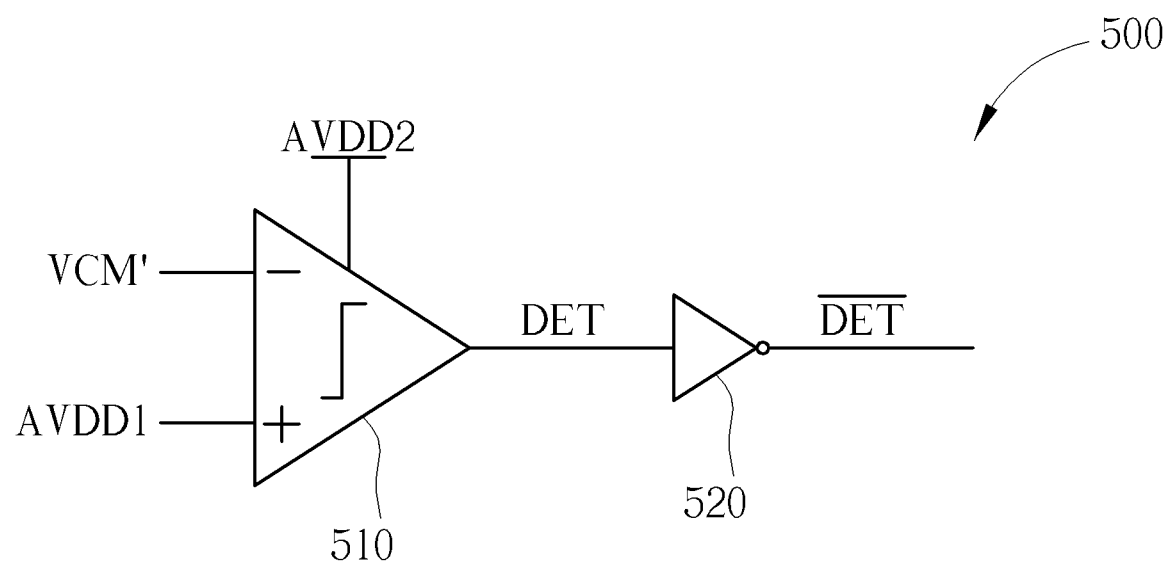
FIG. 5 is a diagram illustrating a detection circuit according to another embodiment of the present invention.

In an embodiment, the circuitry 400 may additionally include a detection circuit, and the detection circuit is used to detect whether the first supply voltage AVDD1 provided to the first amplifier 410 exists, so as to generate a detection result to control the switches SW3 and SW3. Specifically, FIG. 5 is a diagram illustrating a detection circuit 500 according to an embodiment of the invention. As shown in FIG. 5, the detection circuit 500 comprises a comparator 510 and an inverter 520, wherein the comparator 510 is supplied by the second supply voltage AVDD2, and the detection circuit 500 is configured to compare if the first supply voltage AVDD1 is higher than a reference voltage VCM' to generate a detection result DET, where the reference voltage VCM' can be generated by the second supply voltage AVDD2. In this embodiment, when the detection result DET indicates that the first supply voltage AVDD1 exists, the detection result DET enables the switch SW3 while the inverted signal $\overline{DET}$ disables the switch SW4, so that the base of the first transistor M3 is connected to the first supply voltage AVDD1. When the detection result DET indicates that the first supply voltage AVDD1 does not exist, the detection result DET disables the switch SW3 while the inverted signal $\overline{DET}$ enables the switch SW4, so that the base of the first transistor M3 is connected to the reference voltage VCH'.

In the above embodiments, FIGS. 1A and 2 mainly disclose that the first supply voltage AVDD1 of the first power domain is always supplied to the first amplifier 110, but the second supply voltage AVDD2 of the second amplifier 120 may disappear, so the switch SW2 operating in the first power domain is designed to avoid leakage current of the second amplifier 120 when it is in the sleep state. In addition, FIGS. 4 and 5 mainly disclose that the second supply voltage AVDD2 of the second power domain will always be supplied to the second amplifier 420, but the first supply voltage AVDD1 of the first amplifier 410 may disappear, so the switch SW4 operating in the second power domain is designed to avoid the leakage current of the first amplifier 410 when it is in the sleep state. In another embodiment, the above two embodiments can be combined, so that the amplifiers belonging to the two power domains can avoid leakage current when operating in the sleep state. For example, the first amplifier 110 shown in FIG. 1 may be implemented by the first amplifier 410 with the switches SW3 and SW4 shown in FIG. 4, or the second amplifier 420 shown in FIG. 4 may be implemented by the second amplifier 120 with the switches SW1 and SW2 shown in FIG. 1. Since a person skilled in the art should understand how to combine the contents of the above two embodiments after reading the above two embodiments, the details are not repeated here.

Briefly summarized, in the circuitry applied to multiple power domains of the present invention, by connecting the base of the first transistor of the output stage to the reference voltage when detecting that the first/second supply voltage disappears, the leakage current between different circuit blocks can be avoided without blocking the signal transmission path between the circuit blocks, so as to solve the problems in the prior art.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A circuitry applied to multiple power domains, comprising:
   a first amplifier, configured to receive an input signal and generate a processed input signal, wherein the first amplifier is supplied by a first supply voltage of a first power domain; and
   a second amplifier, coupled to the first amplifier, configured to receive the processed input signal and generate an output signal, wherein the second amplifier is supplied by a second supply voltage of a second power domain;
   wherein the second amplifier comprises:
      an output stage comprising a first transistor and a second transistor, wherein the first transistor is coupled between the second supply voltage and an out put terminal, the second transistor is coupled between the output terminal and a ground voltage; and
      a switching circuit, configured to selectively connect a body of the first transistor to the second supply voltage or a reference voltage; and
   a detection circuit, configured to generate a detection result indicating whether the second supply voltage supplied to the second amplifier exists or not;
   wherein the switching circuit selectively connects the body of the first transistor to the second supply voltage or the reference voltage according to the detection result.

2. The circuitry of claim 1, wherein if the detection result indicates that the second supply voltage exists, the switching circuit connects the body of the first transistor to the second supply voltage; and if the detection result indicates that the second supply voltage does not exist, the switching circuit connects the body of the first transistor to the reference voltage.

3. The circuitry of claim 2, wherein the second amplifier further comprises:
   a feedback circuit, coupled between an input terminal and the output terminal of the second amplifier;
   wherein when the detection result indicates that the second supply voltage does not exist, the first amplifier is enabled to make each of the input terminal and the output terminal of the second amplifier has a fixed voltage value; and the switching circuit connects the base of the first transistor to the reference voltage according to the detection result, so that a parasitic diode of the first transistor is maintained in a reverse-biased state to prevent the first transistor from having leakage currents.

4. The circuitry of claim 3, wherein a voltage level of the reference voltage is higher than a voltage level of the output terminal minus a bias voltage of the parasitic diode of the first transistor.

5. The circuitry of claim 3, wherein the reference voltage is generated according to the first supply voltage or a common mode voltage of the processed input signal.

6. The circuitry of claim 1, wherein the first amplifier comprises:
   another output stage comprising a third transistor and a fourth transistor, wherein the third transistor is coupled between the first supply voltage and an output terminal of the first amplifier, and the fourth amplifier is coupled between the output terminal of the first amplifier and the ground voltage;
   another switching circuit, configured to selectively connect a body of the third transistor to the first supply voltage or another reference voltage.

7. A circuitry, comprising:
   an amplifier, comprising:
      an output stage comprising a first transistor and a second transistor, wherein the first transistor is coupled between a supply voltage and an output terminal, the second transistor is coupled between the output terminal and a ground voltage; and
      a switching circuit, configured to selectively connect a body of the first transistor to the supply voltage or a reference voltage;
      wherein the switching circuit selectively connects the body of the first transistor to the supply voltage or the reference voltage according to a detection result, wherein the detection result indicates if the supply voltage supplied to the amplifier exists or not.

8. The circuitry of claim 7, wherein if the detection result indicates that the supply voltage exists, the switching circuit connects the body of the first transistor to the supply voltage according to the detection result; and if the detection result indicates that the supply voltage does not exist, the switching circuit connects the body of the first transistor to the reference voltage according to the detection result.

9. The circuitry of claim 8, wherein the amplifier further comprises:
   a feedback circuit, coupled between an input terminal and the output terminal of the amplifier;
   wherein when the detection result indicates that the supply voltage does not exist, the input terminal and the output terminal of the amplifier are controlled to have fixed voltage values by another circuit; and the switching circuit connects the base of the first transistor to the reference voltage according to the detection result, so that a parasitic diode of the first transistor is maintained in a reverse-biased state to prevent the first transistor from having leakage currents.

10. The circuitry of claim 9, wherein the another circuit is configured to generate an input signal to the input terminal of the amplifier, and the circuitry and the another circuit are located in different chips.

11. The circuitry of claim 9, wherein a voltage level of the reference voltage is higher than a voltage level of the output terminal minus a bias voltage of the parasitic diode of the first transistor.

12. The circuitry of claim 9, wherein the circuitry and the another circuit belong to different power domains, and the reference voltage is generated based on another supply voltage of the another circuit or a common mode voltage of the input signal.

13. A circuitry applied to multiple power domains, comprising:
   a first amplifier, configured to receive an input signal to generate a processed input signal, wherein the first amplifier is supplied by a first supply voltage of a first power domain; and
   a second amplifier, coupled to the first amplifier, configured to receive the processed input signal to generate an output signal, wherein the second amplifier is supplied by a second supply voltage of a second power domain;
   wherein the first amplifier comprises:
      an output stage comprising a first transistor and a second transistor, wherein the first transistor is coupled between the first supply voltage and an output terminal, the second transistor is coupled between the output terminal and a ground voltage; and a switching circuit, configured to selectively connect a body of the first transistor to the first supply voltage or a reference voltage; and a detection circuit, configured to determine if the first supply voltage supplied to the first amplifier exists to generate a detection result;

wherein the switching circuit selectively connects the body of the first transistor to the second supply voltage or the reference voltage according to the detection result.

14. The circuitry of claim 13, wherein if the detection result indicates that the first supply voltage exists, the switching circuit connects the body of the first transistor to the first supply voltage according to the detection result; and if the detection result indicates that the first supply voltage does not exist, the switching circuit connects the body of the first transistor to the reference voltage according to the detection result.

\* \* \* \* \*